United States Patent [19]
Mei et al.

[11] Patent Number: 5,394,294
[45] Date of Patent: Feb. 28, 1995

[54] SELF PROTECTIVE DECOUPLING CAPACITOR STRUCTURE

[75] Inventors: Shaw-Ning Mei; Dominic J. Schepis, both of Wappingers Falls; Andrie S. Yapsir, Pleasant Valley, all of N.Y.

[73] Assignee: International Business Machines Corporation, Armonk, N.Y.

[21] Appl. No.: 992,185

[22] Filed: Dec. 17, 1992

[51] Int. Cl.6 ............................................. H01G 1/11
[52] U.S. Cl. ............................... 361/275.3; 361/275.4; 361/275.2; 361/306.1; 361/328
[58] Field of Search ............... 361/275.3, 306.1, 306.2, 361/272, 275.1, 275.2, 275.4, 328, 329, 330

[56] References Cited

U.S. PATENT DOCUMENTS

| | | | |
|---|---|---|---|
| 1,842,374 | 1/1932 | Dubilier | 361/275.4 |
| 2,216,558 | 10/1940 | Ortlieb | 361/275.4 X |
| 3,303,400 | 2/1967 | Allison | 361/275.4 X |
| 3,619,725 | 11/1971 | Soden et al. | 361/275.1 |
| 3,769,105 | 10/1973 | Chen et al. | 148/175 |
| 3,772,097 | 11/1973 | Davis | 148/175 |
| 4,553,050 | 11/1985 | Feinberg et al. | 307/443 |
| 4,680,670 | 7/1987 | Chan | 361/275.1 |
| 4,720,772 | 1/1988 | Yamane et al. | 361/275.1 |
| 4,757,423 | 7/1988 | Franklin | 361/275.1 |
| 4,894,746 | 1/1990 | Mori et al. | 361/275.1 |
| 4,945,399 | 7/1990 | Brown et al. | 357/74 |
| 5,031,006 | 7/1991 | Meignant | 357/15 |
| 5,032,892 | 7/1991 | Chern et al. | 357/51 |
| 5,050,043 | 9/1991 | Schnabel | 361/275.1 X |

OTHER PUBLICATIONS

IBM Technical Disclosure Bulletin, vol. 29, No. 11, Apr. 1987, Morrison et al, "Ceramic Chip Capacitor Fusing Mechanism," pp. 5084–5085.

IBM Technical Disclosure Bulletin, vol. 31, No. 11, Apr. 1989, Zalesski, "Fused Decoupling Capacitor with Test Electrode," pp. 53–55.

*Primary Examiner*—Marvin M. Lateef
*Attorney, Agent, or Firm*—Whitham, Curtis, Whitham & McGinn; Eric W. Petraske

[57] ABSTRACT

An integrated circuit decoupling capacitor is divided into a plurality of discrete segments. The segments are connected electrically in parallel and are redundant to an extent that if one segment (or if desired more than one segment) fails, the remaining segments have sufficient capacitance to provide the required decoupling function. Each decoupling capacitor segment has a fuse connected in series with it. The fuse opens in response to a fault in a decoupling capacitor segment that would otherwise cause that segment to short the power supply to ground.

7 Claims, 3 Drawing Sheets

SELF PROTECTIVE DECOUPLING CAPACITOR STRUCTURE

BACKGROUND OF THE INVENTION

1. Field of the Invention

This invention relates to an improved integrated circuit, decoupling capacitor and, more particularly, to an integrated circuit, decoupling capacitor that reduces integrated circuit chip rejection due to manufacturing defects in the decoupling capacitor.

2. Description of the Prior Art

In the design of logic circuits, a decoupling capacitor is generally used to isolate the logic circuit from rapid changes in the power supply voltage, so-called power supply bounce. In a typical circuit design, as shown in FIG. 1, the decoupling capacitor is wired directly to the power supply and can cause a failure of an entire chip if only one decoupling capacitor develops a short circuit.

In a conventional integrated circuit process, the decoupling capacitor is a composite made up of layers of thin dielectric films deposited on top of a heavily doped N+ region. In order to achieve a large capacitance, the thickness of the dielectric films is extremely thin (e.g., 60 Å oxide/100 Å nitride) and the capacitor area has to be relatively large. In the process of manufacturing integrated circuits that include such decoupling capacitors, defects, such as a pin hole for example, in the thin, dielectric capacitor films are a common occurrence. Since, as shown in FIG. 1, the decoupling capacitor is connected directly to the power supply, a short in a single decoupling capacitor can result in a failure of the entire chip.

SUMMARY OF THE INVENTION

An object of this invention is provision of a decoupling capacitor that is fault tolerant; a tolerance of production faults in the capacitor layers which tolerance, in turn, increases chip yield.

Another object of this invention is provision of a fault tolerant decoupling capacitor whose construction is compatible with existing process steps and procedures for manufacturing integrated circuits.

Briefly, this invention contemplates the provision of an integrated circuit decoupling capacitor that is divided into a plurality of discrete segments. The segments are connected electrically in parallel and are redundant to an extent that if one segment (or if desired more than one segment) fails, the remaining segments have sufficient capacitance to provide the required decoupling function. Each decoupling capacitor segment has a fuse connected in series with it. The fuse opens in response to a fault in a decoupling capacitor segment that would otherwise cause that segment to short the power supply to ground.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
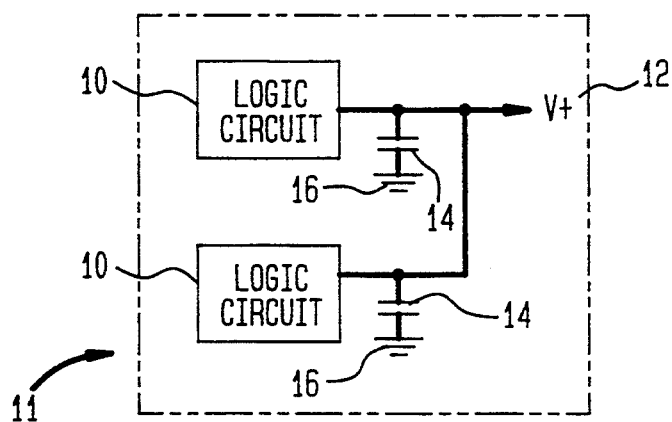
FIG. 1 is a schematic diagram of a prior art decoupling capacitor circuit.

Referring now to FIG. 1, as will be appreciated by those skilled in the art, a typical integrated circuit has a number of logic circuits, such as logic circuits 10, formed on a semiconductor substrate 11 by a sequence of well-known process steps. Each logic circuit 10 is connected to an appropriate voltage source 12 also located on the semiconductor substrate. A decoupling capacitor 14 couples the voltage source 12 to a suitable common or "ground" terminal 16 so that any sharp fluxuations in the voltage (i.e., bounce) of source 12 are shunted through the decoupling capacitor to ground. In this manner, the decoupling capacitor 14 isolates the logic circuit 10 from rapid changes in power supply voltage.

Figure 2:
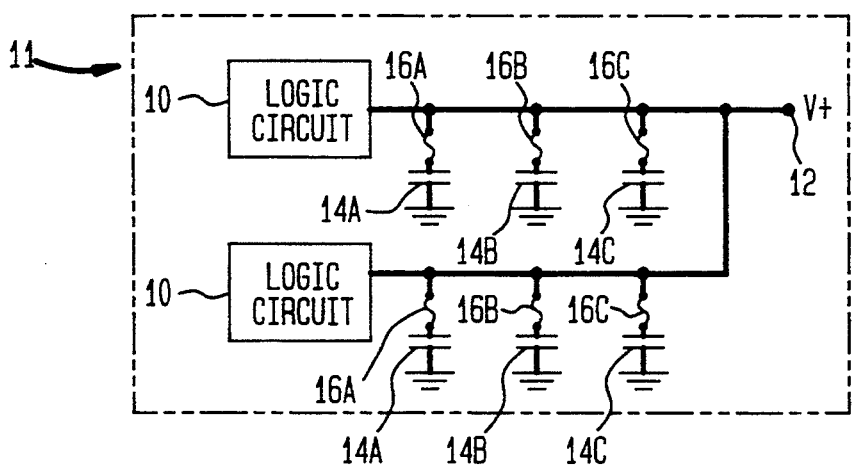
FIG. 2 is a schematic diagram, similar to FIG. 1, of a decoupling capacitor circuit in accordance with the teaching of this invention.

Referring now to FIG. 2, the circuit operation of a decoupling capacitor in accordance with the teaching of this invention is essentially the same as that described in connection with FIG. 1. However, here, the decoupling capacitor 14 has been divided into three discrete segments, 14A, 14B and 14C. There are necessarily at least two discrete capacitor segments connected in parallel, to comprise a single decoupling capacitor in accordance with this invention. Three segments provide somewhat greater redundancy than two segments, provided that a single segment can perform satisfactorily the decoupling function in the event two of the other segments fail. Of course four or more segments could be used, with the number chosen being a matter of design trade-off and choice.

A current sensitive fuse link 16A, 16B and 16C is coupled respectively in series with segments 14A, 14B and 14C. Each fuse segment is designed so that in the event there is a short circuit across its series capacitor segment, the resultant short circuit power supply current cause the fuse link to open, disconnecting the segment from the circuit. The remaining segments are designed so that they have sufficient capacitance to provide the required operating decoupling function for the circuit. Similarly, the structure may be designed so that with, for example, three discrete segments, two could fail, and the remaining segment and its fuse line would have sufficient capacitance and current carrying capacity to provide the required decoupling function in response to a power supply transient.

Figure 3A:
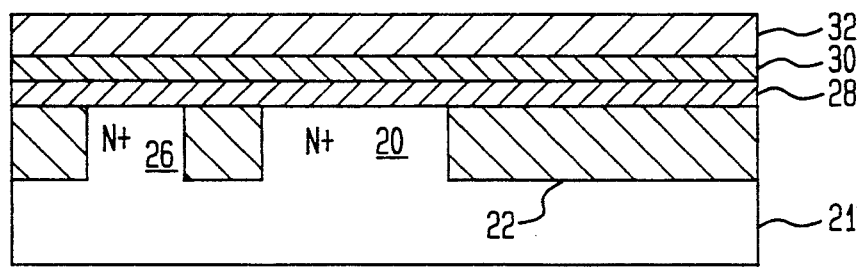
FIGS. 3A through 3F are views at various stages of one embodiment of an integrated circuit decoupling capacitor formed in accordance with the teachings of this invention.

Referring now to FIG. 3A using conventional prior process steps, a heavily doped N+ region 20 is formed in a N doped silicon substrate 21.

Referring now to FIG. 3A, using conventional prior art process steps, a heavily doped N+ region 20 is formed in an N doped silicon substrate 21. The heavily doped N+ region 20 is isolated in a suitable manner by, for example, a shallow silicon oxide isolation trench 22 surrounding the region 20. A heavily doped N+ reach-through 26 in the isolation trench 22 provides one common contact to the decoupling capacitor segments formed on the surface of the N+ region 20.

The decoupling capacitor segments are formed over the N+ region 20 by first depositing thin oxide layer 28 and then a thin nitride layer 30 (e.g., oxide 60 Å and nitride 100 Å) using conventional prior art process steps. For example, the oxide layer 28 could be formed by a CVD deposition or alternatively thermally grown and the nitride may be formed by CVD deposited. A polysilicon layer 32 is next formed on the oxide/nitride layers 28 and 30.

Figure 3B:
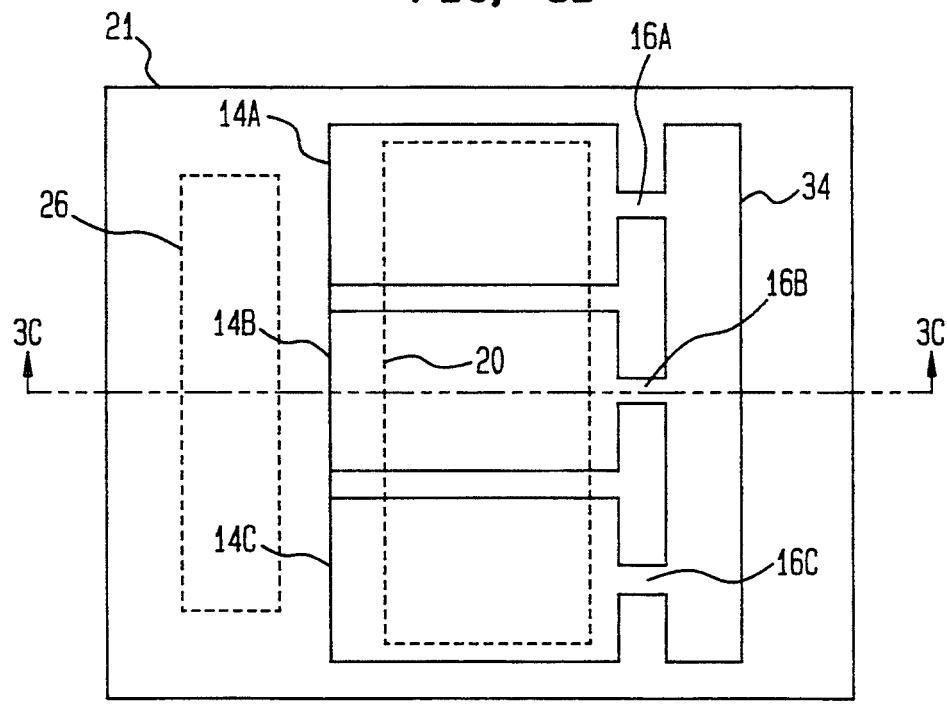
Figure 3C:
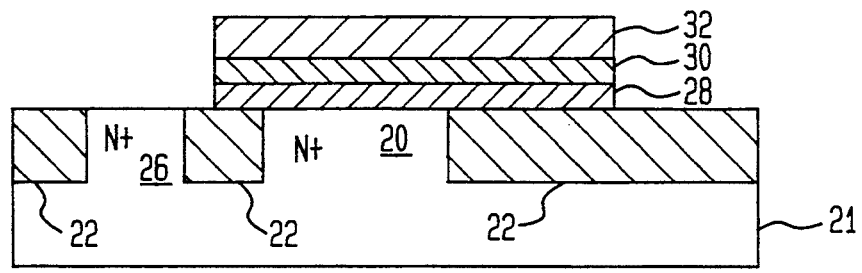

Referring now to FIGS. 3B and 3C, the discrete capacitor segments (14A, 14B, and 14C) and their respective fuse segments (16A, 16B, and 16C) are formed in this specific embodiment of the invention by initially etching the layers of polysilicon, nitride and oxide in desired form of segment plates 14A, 14B, and 14C joined by narrow fuse segments 16A, 16B, and 16C to a common contact region 34. This step in the process can be carried out using well-known photolithography technology. The structure at this stage is shown in FIGS. 3B and 3C.

Figure 3D:
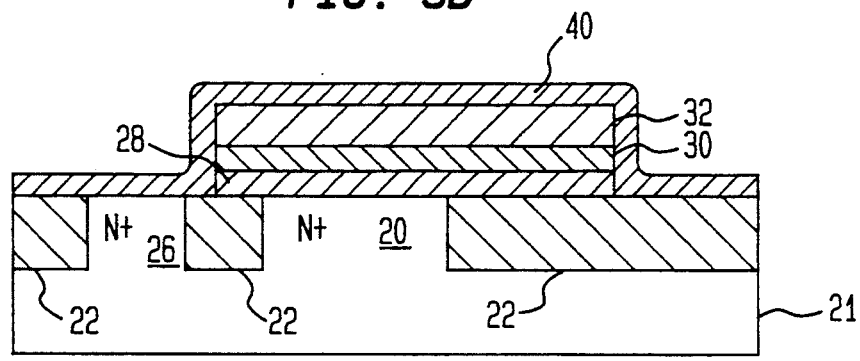
Figure 3E:
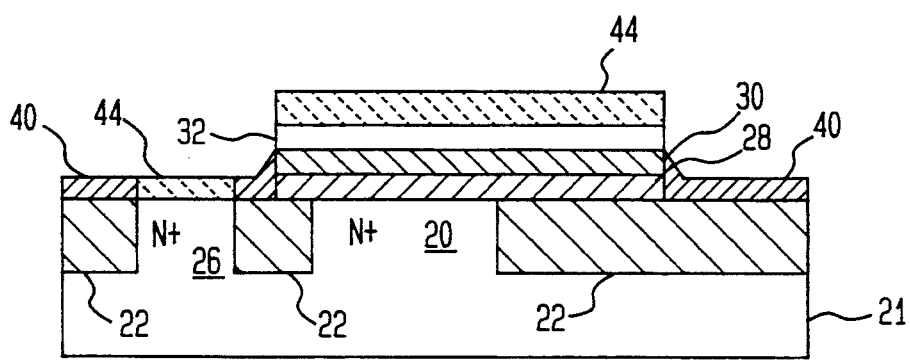
Figure 3F:
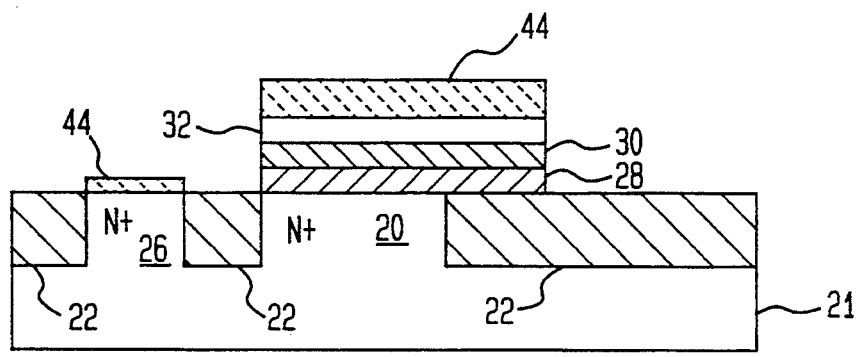

A layer of a suitable refractory metal silicide is next formed over the top surface of the patterned polysilicon layer 32. For example, a layer 40 of titanium (Ti) is deposited over the entire upper surface of the patterned wafer as shown in FIG. 3D. The structure is then annealed or heat treated to form titanium silicide ($TiSi_2$) layer 44 in the regions where the titanium layer was in contact with the polysilicon layer 32 and in contact with the surface of the reach-through 26. The structure at this stage is shown in FIG. 3E. Finally, the unreacted titanium over the trench isolation regions is etched away. The completed segmented capacitor structure is shown in FIG. 3F.

It will be appreciated that a number of alternative process methods known in the art may be used to form the capacitor plates and their associated fuse links. For example, the capacitor segments and their fuse links could be patterned after forming a refractory metal silicide layer. In addition, it should be noted that the segmented plates and their fuse links could be made of a refractory metal (i.e., titanium; cobalt; chromium; tungsten) rather than a refractory metal silicide and the refractory metal could be formed directly on the insulator layers 28 and/or 30.

In a typical embodiment of the invention, the layer 44 is in a range between about 300 Å and 500 Å thick and the fuse links 16 are in a range between 0.5 microns and 3 microns wide. A short circuit current on the order of 10 to 15 milliamperes will cause a typical $TiSi_2$ fuse link to open on the order of a few microseconds. The current causes a rapid heating of the refractory metal or refractory metal silicide and rapid electromigration causes a pulling apart of the material opening the electrical connection.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A decoupling capacitor formed in a semiconductor substrate to protect a logic circuit formed in said semiconductor substrate from rapid changes in power supply voltage connected to said logic circuit, said decoupling capacitor comprising in combination:

an isolated, heavily doped region formed in said substrate, said heavily doped region extending to a top surface of said semiconductor substrate;

a thin insulating layer formed on the top surface of said semiconductor substrate overlying said heavily doped region;

a resistive layer formed on said thin insulating layer, said resistive layer patterned into a plurality of discrete capacitor plates each with an integral narrow fuse link formed of said resistive layer for coupling each of said plurality discrete capacitor plates to said power supply voltage.

2. An integrated circuit decoupling capacitor as in claim 1, wherein each fuse links is on the order of 300 Å to 500 Å thick and 0.5 microns to 3.0 microns wide.

3. A decoupling capacitor formed in a semiconductor substrate to protect a logic circuit formed in said semiconductor substrate from rapid changes in power supply voltage connected to said logic circuit, said decoupling capacitor comprising in combination:

an isolated, heavily doped region formed in said substrate, said heavily doped region extending to a top surface of said semiconductor substrate;

a thin insulating layer formed on the top surface of said semiconductor substrate overlying said heavily doped region;

a refractory metal silicide layer formed on said thin insulating layer, said refractory metal silicide layer patterned into a plurality of discrete capacitor plates each with an integral narrow fuse link formed of said refractory metal silicide layer for coupling each of said plurality discrete capacitor plates to said power supply voltage.

4. An integrated circuit decoupling capacitor as in claim 2, wherein each fuse links is on the order of 300 Å to 500 Å thick and 0.5 microns to 3.0 microns wide.

5. A decoupling capacitor formed in a semiconductor substrate to protect a logic circuit formed in said semiconductor substrate from rapid changes in power supply voltage connected to said logic circuit, said decoupling capacitor comprising in combination:

an isolated, heavily doped region formed in said substrate, said heavily doped region extending to a top surface of said semiconductor substrate;

a thin insulating layer formed on the top surface of said semiconductor substrate overlying said heavily doped region;

a refractory metal layer formed on said thin insulating layer, said refractory metal layer patterned into a plurality of discrete capacitor plates each with an integral narrow fuse link formed of said refractory metal layer for coupling each of said plurality discrete capacitor plates to said power supply voltage.

6. An integrated circuit decoupling capacitor as in claim 3, wherein each fuse links is on the order of 300 Å to 500 Å thick and 0.5 microns to 3.0 microns wide.

7. A decoupling capacitor formed in a semiconductor substrate to protect a logic circuit formed in said semiconductor substrate from rapid changes in power supply voltage connected to said logic circuit, said decoupling capacitor comprising in combination:

an isolated, heavily doped region formed in said substrate, said heavily doped region extending to a top surface of said semiconductor substrate;

a thin insulating layer formed on the top surface of said semiconductor substrate overlying said heavily doped region;

a titanium silicide ($TiSi_2$) layer formed on said thin insulating layer, said titanium silicide ($TiSi_2$) layer patterned into a plurality of discrete capacitor plates each with an integral narrow fuse link formed of said titanium silicide ($TiSi_2$) layer for coupling each of said plurality discrete capacitor plates to said power supply voltage.

* * * * *